(12) United States Patent
French et al.

(10) Patent No.: US 8,010,931 B1
(45) Date of Patent: Aug. 30, 2011

(54) TOOL FOR A CONFIGURABLE INTEGRATED CIRCUIT THAT USES DETERMINATION OF DYNAMIC POWER CONSUMPTION

(75) Inventors: Matthew C. French, Falls Church, VA (US); Li Wang, Boise, ID (US); Deepak Agarwal, Austin, TX (US); Azadeh Davoodi, Madison, WI (US)

(73) Assignee: University of Southern California, Los Angeles, CA (US)

( * ) Notice: Subject to any disclaimer, the term of this patent is extended or adjusted under 35 U.S.C. 154(b) by 759 days.

(21) Appl. No.: 11/678,994

(22) Filed: Feb. 26, 2007

Related U.S. Application Data (60) Provisional application No. 60/776,379, filed on Feb. 24, 2006.

(51) Int. Cl.
*G06F 17/50* (2006.01)
(52) U.S. Cl. ........ 716/133; 716/132; 716/134; 716/135; 703/14
(58) Field of Classification Search .......... 716/132–135; 703/14
See application file for complete search history.

(56) References Cited

U.S. PATENT DOCUMENTS

| | | | | |
|---|---|---|---|---|
| 4,698,760 A * | 10/1987 | Lembach et al. | | 716/6 |
| 6,397,170 B1 * | 5/2002 | Dean et al. | | 703/14 |
| 6,424,959 B1 * | 7/2002 | Bennett et al. | | 706/13 |
| 6,477,683 B1 * | 11/2002 | Killian et al. | | 716/1 |
| 6,578,176 B1 * | 6/2003 | Wang et al. | | 716/2 |
| 6,968,514 B2 * | 11/2005 | Cooke et al. | | 716/1 |
| 7,000,204 B2 * | 2/2006 | McGuffin et al. | | 716/5 |
| 7,039,882 B2 * | 5/2006 | Rana et al. | | 716/3 |
| 7,107,566 B1 * | 9/2006 | McElheny | | 716/16 |
| 7,129,745 B2 * | 10/2006 | Lewis et al. | | 326/38 |
| 7,143,368 B1 * | 11/2006 | Plofsky et al. | | 716/2 |
| 7,287,171 B1 * | 10/2007 | Mendel et al. | | 713/300 |
| 7,337,100 B1 * | 2/2008 | Hutton et al. | | 703/13 |
| 7,500,216 B1 * | 3/2009 | Blunno et al. | | 716/18 |
| 7,551,985 B1 * | 6/2009 | Chen et al. | | 700/297 |
| 2005/0204316 A1 * | 9/2005 | Nebel et al. | | 716/2 |
| 2007/0164785 A1 * | 7/2007 | He | | 326/41 |
| 2007/0198971 A1 * | 8/2007 | Dasu et al. | | 717/140 |
| 2007/0234266 A1 * | 10/2007 | Chen et al. | | 716/13 |

OTHER PUBLICATIONS

Gayasen et al.; "Reducing Leakage Energy in FPGAs Using Region-Constrained Placement"; FPGA'04; Feb. 2004; Monterey; California; USA; pp. 1-8.*
Actel screenshot; obtained from the Internet at http://www.actel.com, on Aug. 6, 2007, document is undated, 1 page.
Aeroflex FPGA screenshot; obtained from the Internet at http://www.aerotlex.com/ProductPages/RH_fpga.cfm, on Aug. 6, 2007, document is undated, 2 pages.
Altera's PowerPlay tools screenshot; obtained from the Internet at http://www.altera.com/products/software/products/quartus2/design/qts-power_analysis.html, on Aug. 6, 2007, document is undated, 3 pages.
Xilinx XPower screenshot; obtained from the Internet at http://www.xilinx.com/products/design_tools/logic_design/verification/xpower.htm on Aug. 6, 2007, document dated 1994-2007, 2 pages.

* cited by examiner

*Primary Examiner* — Naum Levin
(74) *Attorney, Agent, or Firm* — Fish & Richardson P.C.

(57) ABSTRACT

A configurable logic tool that allows minimization of dynamic power within an FPGA design without changing user-entered specifications. The minimization of power may use minimized clock nets as a first order operation, and a second order operation that minimizes other factors, such as area of placement, area of clocks and/or slack.

14 Claims, 9 Drawing Sheets

TOOL FOR A CONFIGURABLE INTEGRATED CIRCUIT THAT USES DETERMINATION OF DYNAMIC POWER CONSUMPTION

CROSS-REFERENCE TO RELATED APPLICATIONS

This application claims priority to U.S. Provisional Application 60/776,379, filed Feb. 24, 2006. The disclosure of the prior application is considered part of (and is incorporated by reference in) the disclosure of this application.

FEDERALLY SPONSORED RESEARCH OR DEVELOPMENT

The U.S. Government may have certain rights in this invention pursuant to Grant No. NAGS-13516 awarded by NASA.

BACKGROUND

Many different kinds of configurable integrated circuits are known. For example, field programmable gate arrays, or FPGAs, include many different gates which can be configured in different ways to carry out different functions. FPGAs can be used to configure as simple logic gates, as more complex gates, digital signal processors, or basically any other type of circuitry.

An FPGA is typically configured using a software tool which carries out a computer-aided design or "CAD" device. The CAD device defines the connections between the gates in the programmable logic, to allow the logic to carry out different functions.

Current FPGA CAD tools include Xilinx's Xpower tool, Altera's PowerPlay tools, Aeroflex's FPGA tools and Actel's tools.

SUMMARY

The present application describes dynamic control of computer-aided design for a configurable integrated circuit using optimizations which minimize the power consumption of the resultant circuit.

Embodiments describe how the power minimizations are maintained as secondary to the user-entered characteristics.

Embodiments also define the different kinds of power minimization techniques that are used.

BRIEF DESCRIPTION OF THE DRAWINGS

These and other aspects will now be described with reference to the accompanying drawings, in which.

DETAILED DESCRIPTION

The present application describes an environment based on software that enables power optimized placement and routing of a circuit formed from programmable logic such as an FPGA. According to an embodiment, aspects may change placement and routing in a way that minimizes dynamic power consumption, that is, the power consumption that occurs as the chip components are actually being used, as compared with as they are powered but idle.

Figure 1:
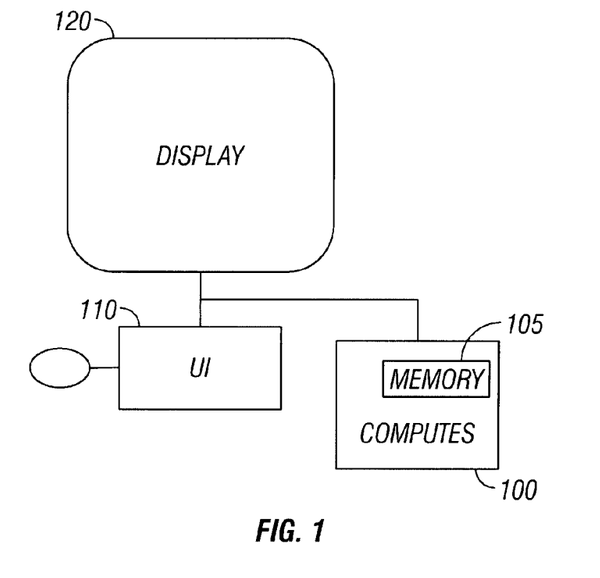
FIG. 1 shows a block diagram of the overall system.
Figure 2:
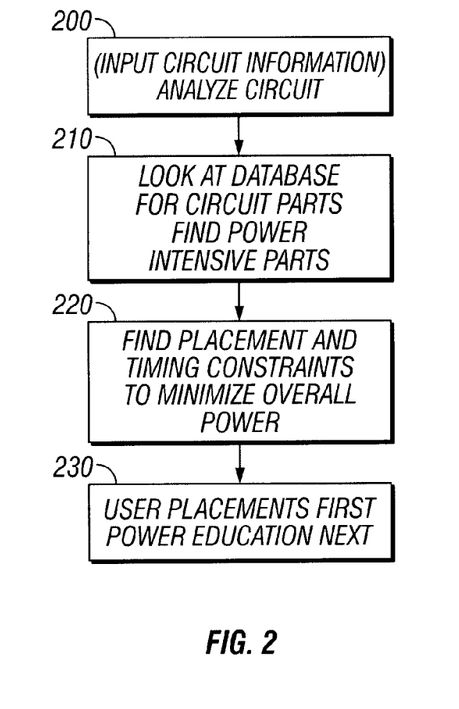
FIG. 2 shows a flowchart of operation of the system.

An embodiment is shown in FIG. 1, and explained with reference to the flowchart of FIG. 2. The system in FIG. 1 shows a workstation which can be any general purpose computer 100 that runs a program that is stored in memory 105. The program may also rely on database information which may also be stored in memory 105. A user interface 110 may include a keyboard and mouse as shown. Information including a toolbox of options and displays are displayed on display 120. The software runs according to the flowchart of FIG. 2.

The operation starts at 200, where information about the user's circuit is either input or imported. The import can be from any standard FPGA CAD program. This is a standard characteristic of FPGA design software, where the different parts of the circuit has been defined. For example, a circuit may include multiple different functional blocks which carry out different functions. Any of the functional blocks may themselves be embodied by predefined layouts, e.g., layouts of shift registers and the like. Many different programs exist which allow reconfiguring FPGAs to form many different circuits and functions.

The circuit is analyzed at 200 to determine the different aspects therein. At 210, the program analyzes aspects based on a database to determine the power intensive characteristics of the circuit.

220 then uses power optimization algorithms and techniques to change at least one of placement and routing of the circuit to minimize the power. These changes are called power layout constraints. The optimizations may be based on creating minimal dynamic power consumption.

230 carries out the actual optimizations. In an embodiment, user defined placement and timing constraints are given priority over the power optimizations determined in 220. This hence ensures that the original placement and throughput specifications of the design are achieved. The optimizations that are made to placement and routing do not affect the functional operation of the circuit. However, within the user defined placement and timing constraints, additional power optimizations are carried out.

In an embodiment, the device can also rely on sources of knowledge, and yield better results when more accurate knowledge sources are used. The device can also rely on its own post synthesis power prediction models to estimate circuit power consumption before placement and routing is completed.

Another embodiment can simulate detailed capacitance information from the placed and routed circuit. This model can be augmented with simulated wire toggle rates. These toggle rates can be obtained either through simulation, or power analysis tools or by importing third part simulation files such as COTS or Modelsim files.

The embodiment has operated these techniques using the Xilinx VirtexII family of FPGAs, the Xilinx VirtexII Pro and the Xilinx Virtex4 devices. However, the techniques described herein can be used in other programmable logic, such as the Xilinx Spartan FPGA family. Actual tests have suggested that power reduction of as much as 24% is achievable.

According to another embodiment, the present system uses power driven placement and routing. These placement and routing systems are application dependent. A suite of power optimization algorithms may be used such that different power optimization can be used for different classes of design. For example, a first power optimization algorithm may be used for simple gates, and a second very different power optimization algorithm may be used for digital signal processors.

The prediction models may also enable identifying power critical areas of the circuit and performing optimizations without considering detailed timing level information and routing.

Any of a number different known techniques can be used to carry out the power minimization. For example, prior art techniques include synthesis level power optimizations, reducing glitching power through pipelining, and others. An embodiment describes a throughput based power minimization system.

Today's FPGAs are estimated to consume between 50% and 70% of their total power in their interconnection network. The dynamic power of these networks is proportional to the capacitance and toggle rate of the network, as well as the internal voltage. Also, the capacitance of any component can be considered as having two parts: the capacitance of the component itself as well as the capacitance of the interconnect route that it drives. The embodiment reduces dynamic power by reducing its capacitance or length. Any net that has a high toggle rate or a high capacitance may be a proper target for this kind of power minimization.

Four different power optimization techniques are disclosed as embodiments herein. Any or all of these optimization techniques may be used in this application.

An embodiment uses optimization for the Virtex II FPGA from Xilinx. This FPGA has input-output blocks, and configurable logic blocks, where each configurable logic block includes four slices and an interconnect. The slices provide the functional elements for combinatorial and synchronous logic. These elements can hence be configured as ROMs, lookup tables, SLRs, flip flops, or other circuitry.

One can also consider the global routing matrix which is formed of different kinds of lines, including long lines, hex lines, double lines and direct connect lines. Each of these lines has a different capacitance: the direct line has a capacitance of 9.4 pF, the double line 13.2 pF, a hex line has 18.4 pF, and the long line has 26.1 pF.

It can be seen that changing the interconnect can greatly reduce the capacitance.

The Virtex II also supports different kinds of clocks: 16 clocks and 8 global clocks are in each quadrant of the device.

In operation, the tool described herein allows importing information indicative of the placement and routing from any other tool. The tool then uses information from its internal database, called herein "knowledge", such as the above about the circuit components and interconnect capacitance. It monitors a circuit's power consumption during simulation. It then sorts the most power intensive modules within the circuit and plots the various power consumption metrics of the circuit.

For example, using the Xilinx circuit, the power calibration component can interact with the Xilinx CAD tools to extract the parameters it needs for power modeling including capacitance, toggle rates, fanout and power. The Xilinx Xpower reports include detailed analyses of the placed and routed circuit power characteristics. The tool uses this information to obtain the capacitance value of every component, logic element and interconnect. This information is used to track and display dynamic power consumption during simulation, or to use these values as dynamic power libraries for post-synthesis power modeling and estimation.

This component allows detailed power analysis of the user circuit both at the post-synthesis level and at the routed level.

As described above, the tool does not modify design logic, but rather feeds additional constraints into the tools to allow the existing algorithms to still meet throughput specification while also reducing power. A power optimization component is described herein that inspects the area, resources and size of the targeted FPGA device, reads in file constraints set by the user, and prioritizes the original constraints.

Power optimization techniques include clock tree paring, and terminal net location, area minimization, and slack minimization. Each of these techniques may be used individually or collectively.

The clock tree paring reduces the amount of power used by the clock nets. The clock nets can contribute between 12 and 79% of the overall power consumption of an FPGA's design. This may be due to the inherent high toggle rate, high fan outs, and other parameters of the clock rate. Clock tree paring targets the clock power by using placement constraints to minimize the size of the clock tree.

An embodiment may categorize the gating switches according to their type. In this embodiment, gating switches are categorized as being either a trunk switch, a branch switch or leaf switch. Different operations may be applicable depending on the type of the switch.

Figure 3A:
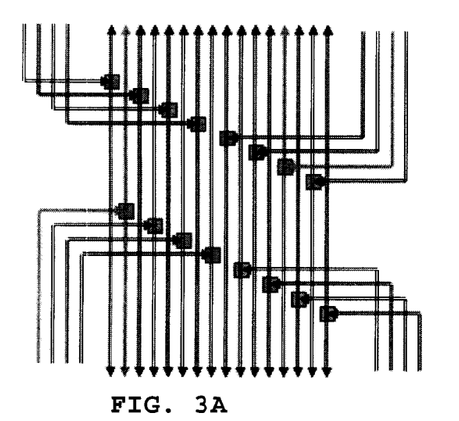
FIGS. 3A-3E show the different exemplary types of clock net switch types and locations.

The trunk switch, shown in FIG. 3A, is typically at the center of the chip. FIG. 3A shows clock nets being switched to both top half and the bottom half of the chips in this way.

Figure 3B:
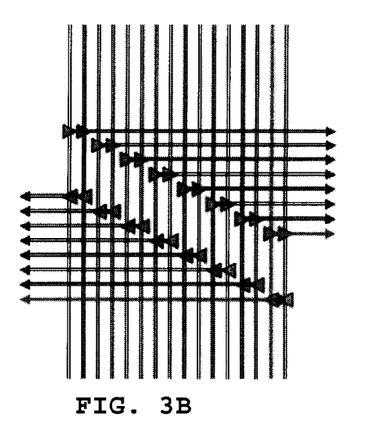

FIG. 3B illustrates a branch switch. These kinds of branch switches are located in the path of the main clock trunks and are responsible for transmitting clock signals to the clock regions. The clock wire travels to both the left and the right.

Figure 3C:
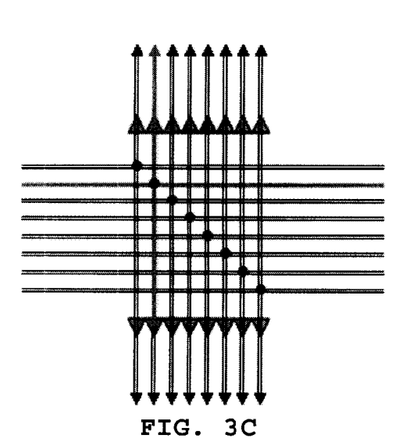

FIG. 3C illustrates a leaf switch.

Figure 3D:
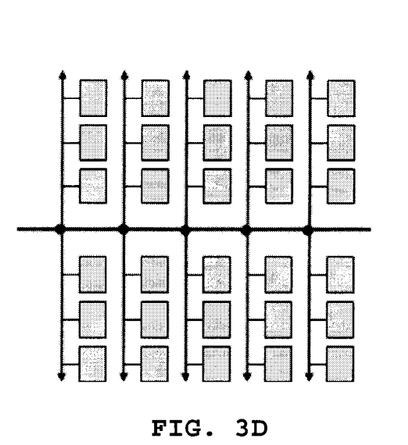
Figure 3E:
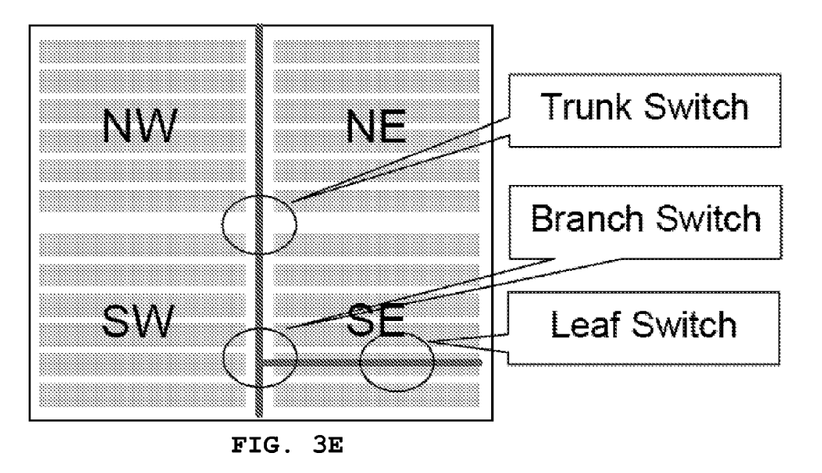

FIG. 3D illustrates how a clock that in the clock region may include a major branch and many sub branches that include connect to slices. The leaf switch of FIG. 3C turns on and off these sub branches.

It has been found in this embodiment that placing the flip-flops closer to each other reduces clocking power by leaving more branches and sub branches turned off.

Figure 4:
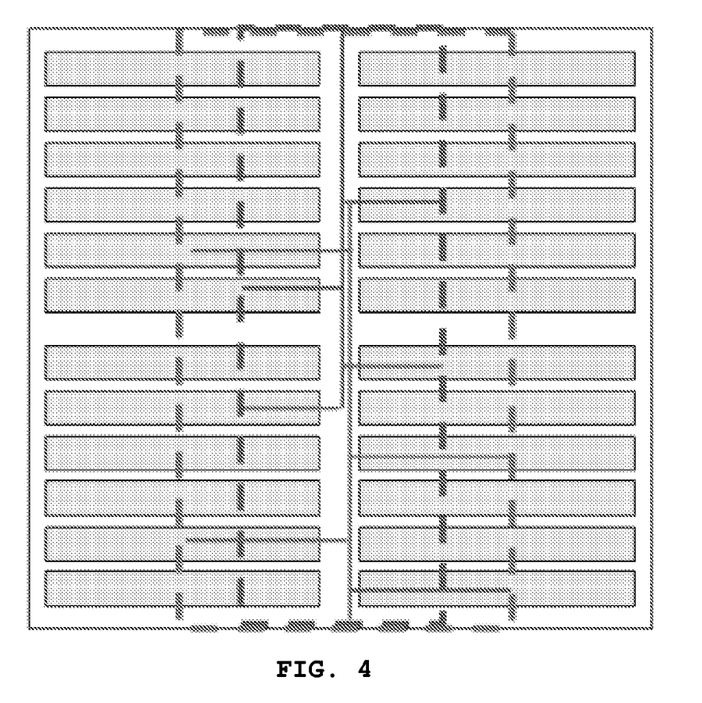
FIG. 4 shows exemplary clock area constraints.

In operation, the clock tree pairing algorithm analyzes a user's circuit, and computes a minimum bound to contain all the logic associated with the clock net. This bound is used to generate area constraints to specify where the clock logic may be placed. A rectangular area constraint may be used which stretches north to south around the main trunk. The size of the area may be proportional to the fan out of the clock. For example, FIG. 4 illustrates clock area constraints for the different clocks.

The N-terminal net co location power optimization reduces the power consumed by the signal nets. The 'terminal' denotes the sum of the fan-in and fan-out of the net. For example, a two terminal map may be a net with a single fanout.

Net terminals are grouped in pairs. Each pair is optimized using a constraint that restricts the two terminals to be located close to one another and thus reduces the signal net length and power.

In the embodiment, it is also noted that different FPGAs may have different biases. For example, the Virtex II architecture has an East-West bias; which means that a direct connection interconnect in the east-west direction has less capacitance and direct connections than the north-south direction. Accordingly, the co location technique may prioritize east to west relative placement constraints.

Other FPGA architectural features can be similarly taken into account.

This technique may also operate according to rules which are used to avoid overconstraining the designs. For example, the rules may avoid nets that are part of shift registers. In the Xilinx slice, shift registers have inherently low capacitance.

Other rules may include avoiding that are part of carry chains, since these are also low capacitance. The system may also avoid nets that are mapped internally to slices as low capacitance routes.

Area minimization may also be used as another power reduction technique. The area minimization is based on the observation that routing interconnect lengths is highly dependent on the placement of components. The location of the components may be prioritized in favor of power to group together high capacitance signal lines with high fanout or high transition rates. Constraining this area may also trim the clock tree.

Finally, slack minimization may optimize the power and signal nets by tightening the timing constraints on the power critical components. The slack minimization assumes that existing tools leave each net more or less as with conventional timing relationships. However, timing constraints on the certain nets with ample slack, for example, may be those with two or less levels of combinatorial logic between the flip-flops. In these techniques, for example, certain 2 ns slacks may be reduced to 1 ns.

It was found experimentally that the clock paring provided the best results, while the rest of the techniques provided mixed results: working sometimes but not producing marked improvements. However, the combined power optimization was still very effective.

In an embodiment, clock tree paring may be considered as a first-order optimization prior to measuring results of the second order optimizations formed by net colocation, area minimization, and slack minimization.

Figure 5A:
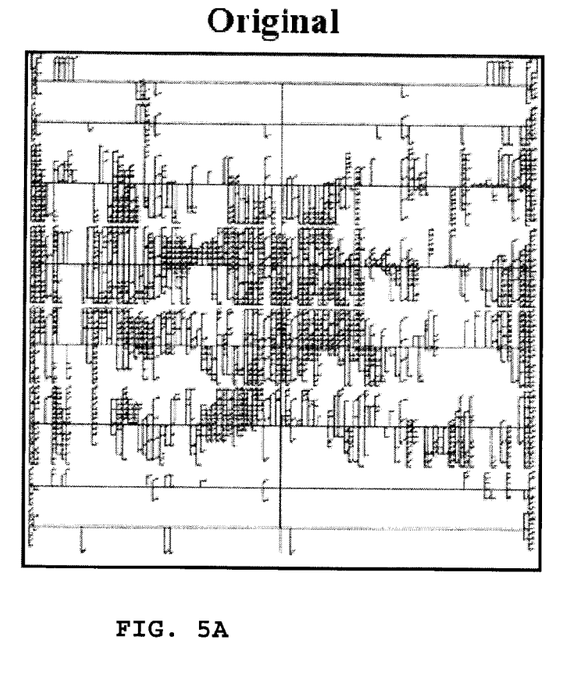
FIGS. 5A-5H show results of the different types of power minimization.
Figure 5B:
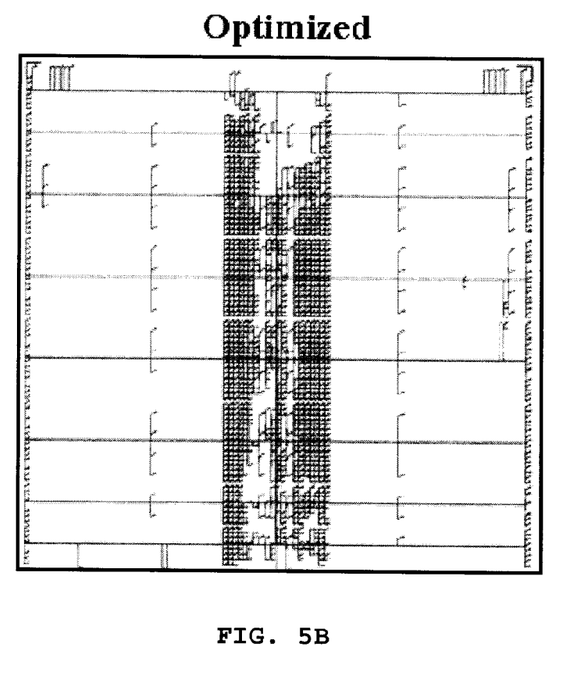

FIGS. 5A and 5B illustrate clock area optimization, with FIG. 5A illustrating how the clock area is originally, and FIG. 5B illustrating the optimized clock area.

Figure 5C:
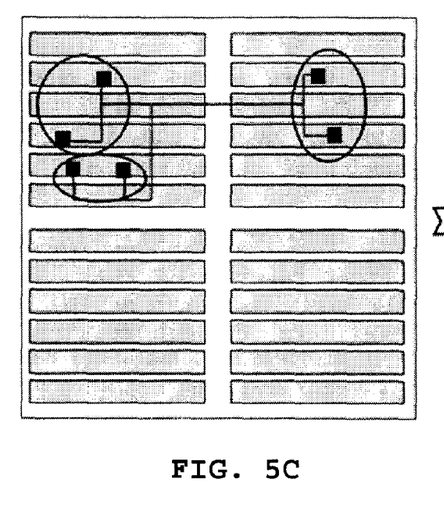
Figure 5D:
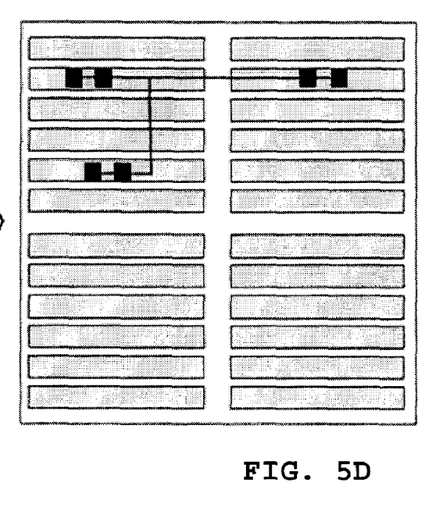

FIGS. 5C and 5D illustrate how the net terminals can be optimized, with FIG. 5C illustrating the unoptimized placement, and FIG. 5D illustrating the optimized placement.

Figure 5E:
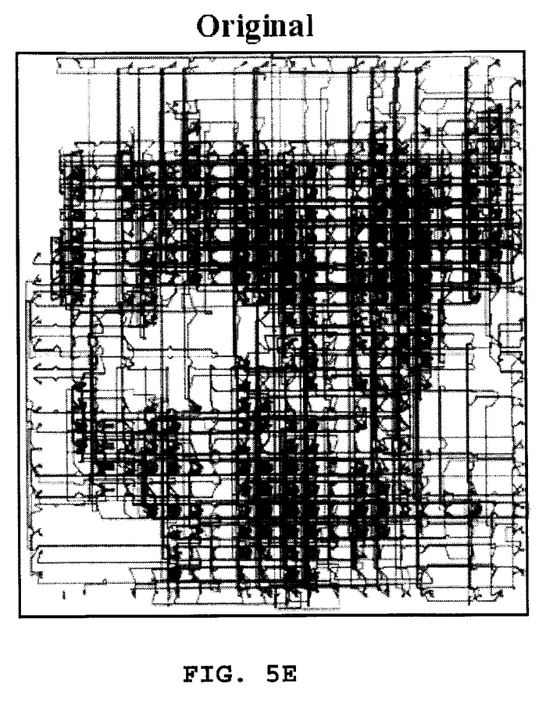
Figure 5F:
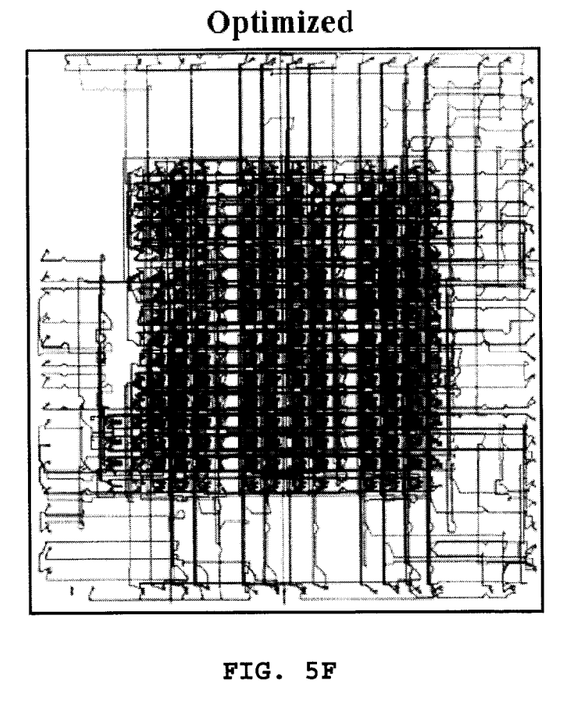

FIGS. 5E and 5F illustrate area minimization, with FIG. 5E showing the original, and FIG. 5F showing an optimized version.

Figure 5G:
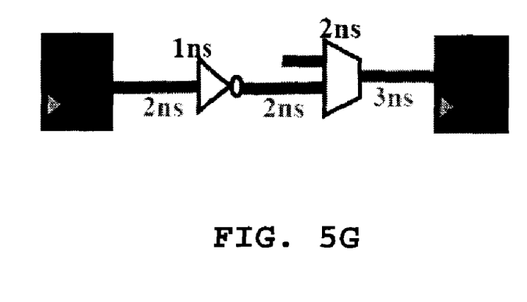
Figure 5H:
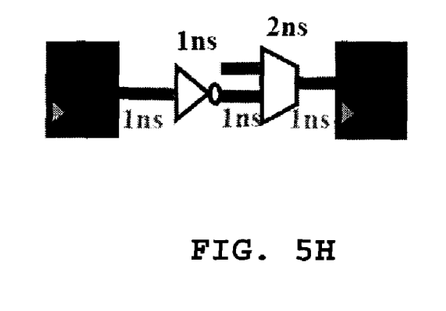

Finally, FIGS. 5G and 5H illustrate Slack optimization, with FIG. 5G showing gates with the original amounts of Slack, FIG. 5H showing a minimized version of those slack values.

Figure 6:
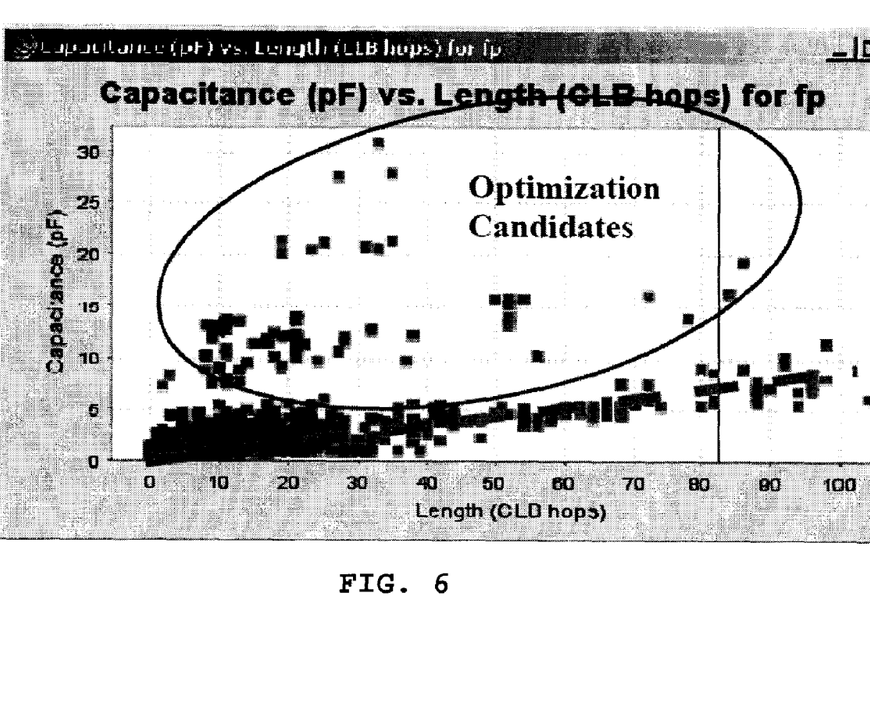
FIG. 6 shows a net characteristic plot.

Another tool that may assist in determining optimize power models includes a visualization and verification tool. This tool allows plotting the capacitance versus net length number of units or number of loads. For example, FIG. 6 shows a net characteristic plot. All elements within the circle 600 may be considered as good optimization candidates.

The general structure and techniques, and more specific embodiments which can be used to effect different ways of carrying out the more general goals are described herein.

Although only a few embodiments have been disclosed in detail above, other embodiments are possible and the inventors intend these to be encompassed within this specification. The specification describes specific examples to accomplish a more general goal that may be accomplished in another way. This disclosure is intended to be exemplary, and the claims are intended to cover any modification or alternative which might be predictable to a person having ordinary skill in the art. For example, these techniques can be used with other forms of configurable logic. Other power minimization techniques may be used. Other FPGAs may be optimized, besides the ones described herein.

Also, the inventors intend that only those claims which use the words "means for" are intended to be interpreted under 35 USC 112, sixth paragraph. Moreover, no limitations from the specification are intended to be read into any claims, unless those limitations are expressly included in the claims. The computers described herein may be any kind of computer, either general purpose, or some specific purpose computer such as a workstation. The computer may be an Intel (e.g., Pentium or Core 2 duo) or AMD based computer, running Windows XP or Linux, or may be a Macintosh computer. The computer may also be a handheld computer, such as a PDA, cellphone, or laptop.

The programs may be written in C, or Java, Brew or any other programming language. The programs may be resident on a storage medium, e.g., magnetic or optical, e.g. the computer hard drive, a removable disk or media such as a memory stick or SD media, or other removable medium. The programs may also be run over a network, for example, with a server or other machine sending signals to the local machine, which allows the local machine to carry out the operations described herein.

Where a specific numerical value is mentioned herein, it should be considered that the value may be increased or decreased by 20%, while still staying within the teachings of the present application, unless some different range is specifically mentioned.

What is claimed is:

1. A method comprising:
obtaining, by a computer, circuit information, indicative of a circuit formed by a plurality of functional blocks within configurable logic;
determining, by the computer, at least one of placement and timing constraints which can minimize overall power consumption within the circuit as power layout constraints;
receiving, by the computer, user defined placement and timing criteria for the circuit; and
forming, by the computer, a layout for the circuit by associating higher priority with the user defined placement and timing criteria compared to the at least one of placement and timing criteria, wherein the layout is power minimized while maintaining the user defined placement and timing criteria for the circuit.

2. A method as in claim 1, wherein said determining placement and timing constraints uses a dynamic power prediction model.

3. A method as in claim 1, wherein said determining placement and timing constraints uses capacitance information and minimizes at least one capacitance value.

4. A method as in claim 1, wherein said determining placement and timing constraints uses simulated wire toggle rates.

5. A method as in claim 1, wherein said configurable logic is an FPGA.

6. A method as in claim 1, wherein said minimizing overall power consumption includes reducing an amount of power used by clock nets, by minimizing the size of the clock nets.

7. A method as in claim 6, wherein said minimizing comprises characterizing the clock as being one of a plurality of different types of clock nets, and optimizing each type of clock net individually.

8. A method as in claim 1, wherein said minimizing overall power consumption includes restricting placement of associated terminal nets to be within a specified distance of one another.

9. A method as in claim 1, wherein said minimizing overall power consumption comprises minimizing an area of overall placement of components within the configurable logic.

10. A method as in claim 1, wherein said minimizing overall power consumption comprises minimizing an area of clocks within the configurable logic.

11. A method as in claim 1, wherein said minimizing overall power consumption comprises minimizing a slack within certain circuits within the configurable logic.

12. A method as in claim 1, wherein said minimizing overall power consumption comprises reducing a size of clock nets as a first order minimization.

13. A method as in claim 12, wherein said minimizing power consumption further comprises all of minimizing an area of overall placement of components within the configurable logic, minimizing an area of clocks within the configurable logic, and minimizing a slack within certain circuits within the configurable logic as a second-order minimization.

14. A method as in claim 1, wherein said minimizing power consumption comprises all of reducing a size of clock nets, minimizing an overall placement of components within the configurable logic, minimizing an area of clocks within the configurable logic, and minimizing a slack within certain circuits within the configurable logic.

* * * * *

UNITED STATES PATENT AND TRADEMARK OFFICE
CERTIFICATE OF CORRECTION

| | | |
|---|---|---|
| PATENT NO. | : 8,010,931 B1 | Page 1 of 1 |
| APPLICATION NO. | : 11/678994 | |
| DATED | : August 30, 2011 | |
| INVENTOR(S) | : Matthew C. French | |

It is certified that error appears in the above-identified patent and that said Letters Patent is hereby corrected as shown below:

Title Page, column 1, line 1 (Title), item (54); before "TOOL" insert -- DESIGN --.

First Page, column 2, line 7 (Other Publications), delete "aerotlex" and insert -- aeroflex --.

Second Page, column 1, line 1 before "TOOL" insert -- DESIGN --.

In Claim 1, column 6, line 38, delete "criteria" and insert -- constraints --.

Signed and Sealed this
Twenty-fifth Day of October, 2011

David J. Kappos
*Director of the United States Patent and Trademark Office*